United States Patent
Lyons et al.

(10) Patent No.: US 6,790,790 B1
(45) Date of Patent: Sep. 14, 2004

(54) HIGH MODULUS FILLER FOR LOW K MATERIALS

(75) Inventors: Christopher F. Lyons, Fremont, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/302,227

(22) Filed: Nov. 22, 2002

(51) Int. Cl.[7] .............................................. H01L 21/31
(52) U.S. Cl. ....................... 438/780; 438/781; 438/782; 438/692
(58) Field of Search ................................ 438/623, 692, 438/780–782

(56) References Cited

U.S. PATENT DOCUMENTS

| 6,008,540 | A | * | 12/1999 | Lu et al. ..................... 257/758 |
| 6,380,105 | B1 | | 4/2002 | Smith et al. |
| 6,437,007 | B1 | | 8/2002 | Smith et al. |
| 6,565,763 | B1 | * | 5/2003 | Asakawa et al. .............. 216/56 |
| 2002/0017641 | A1 | * | 2/2002 | Lu et al. ........................ 257/3 |
| 2002/0115285 | A1 | * | 8/2002 | Wong .......................... 438/638 |

* cited by examiner

*Primary Examiner*—Mary Wilczewski
*Assistant Examiner*—Toniae M. Thomas
(74) *Attorney, Agent, or Firm*—Amin & Turocy, LLP

(57) ABSTRACT

Disclosed are methods for processing a low k material involving providing a low k material layer comprising one or more low k polymer materials and one or more high modulus fillers on a semiconductor substrate, and chemical mechanical polishing the low k material layer so as to remove a portion of the low k material layer from the semiconductor substrate without substantially damaging unremoved portions of the low k material layer. In this connection, low k material layers for a semiconductor structure containing one or more low k polymer materials and one or more high modulus fillers are disclosed, as well as methods of making the low k material layers.

21 Claims, No Drawings

HIGH MODULUS FILLER FOR LOW K MATERIALS

TECHNICAL FIELD

The present invention generally relates to processing low k materials on a semiconductor substrate. In particular, the present invention relates to methods of making and chemical mechanical polishing a low k material layer containing a high modulus filler.

BACKGROUND ART

High performance integrated circuit chips contain of millions of transistors that perform various functions including random access memory, central processing communications, and the like. Each of the transistors is interconnected with electrically conducting elements. In order to efficiently accomplish this on a single chip, a typical integrated circuit chip contains multiple layers of conducting elements. Since there are size constraints associated with placing millions of conducting elements on a chip having an area of only a few square centimeters, the connecting elements themselves are very small, and the distance that separates conducting elements is small as well.

Dielectric materials are widely used in the semiconductor industry to separate structures on an integrated circuit chip, such as separating metal interconnect layers from active devices. Dielectrics are also used to separate two adjacent metal interconnect layers to prevent shorting between the metal layers. With an increasing number of levels in integrated circuit chips, there is growing emphasis on the quality of so-called interlevel dielectrics. This is because multiple levels of metal interconnects are necessary in order to achieve higher packing densities and smaller chip sizes with increased circuit complexity.

The smaller geometries raise certain electrical performance problems that are not of concern in older generation integrated circuits. The reduced spacing results in increased electrical capacitance, which in turn causes capacitative interconnect delay that can slow down the operational speed of the circuit. Increased capacitance increases the amount of power that the integrated circuit requires to operate. Increased capacitance also causes cross-talk that can result in generating signal errors.

Since the dimensions of current integrated circuits are constrained, and since the trend is to continue decreasing geometries, it is necessary to reduce the capacitance in integrated circuit chips. Conventional semiconductor fabrication commonly uses high density or conventional silicon dioxide and/or spin-on glass as a dielectric.

One disadvantage associated with high density silicon dioxide and/or spin-on glass dielectrics is their relatively high permitivity or dielectric constant. Typically, high density silicon dioxide and/or spin-on glass have a relative (to permitivity of free space) dielectric constant of 3.9 or higher. High dielectric constant materials produce capacitive loads on the adjacent conductors which degrades performance of both high frequency and high density transistors.

Another disadvantage associated with high density silicon dioxide and/or spin-on glass dielectrics is that thicker dielectric layers are required to compensate for the high dielectric constant. Thicker layers result in larger geometry devices, increasing the overall size and cost of the integrated circuit chip while reducing functionality. Additionally, thick dielectric layers increase planarization problems, making it difficult to form multi-layer metallizations on top of the dielectrics.

Generally speaking, therefore, it is desirable to provide a dielectric material layer with a high breakdown field strength and low leakage current. Low k material layers are attractive in this respect because they possess both high breakdown field strength and low leakage current. However, there are problems associated with forming low k material layers. For instance, heat causes deleterious structural damage to a low k material layer or film (structural collapse of the low k material). Temperatures as low as 350° C. can cause such damage in certain low k material layers. This is a problem because semiconductor processing often involves high temperature steps. Consequently, various layers used in fabricating semiconductor devices must be able to withstand high temperatures.

Another problem associated with low k material layers involves lack of structural integrity or lack of mechanical strength. This deficiency limits the extend to which further processing can be employed with low k material layers. For example, although chemical mechanical polishing (CMP) techniques are widely used in semiconductor fabrication, CMP techniques are not typically used to process low k material layers due to the lack in hardness.

SUMMARY OF THE INVENTION

The present invention provides methods for making semiconductor structures with improved low k insulation materials. The present invention also provides methods for forming high quality low k material layers in semiconductor structures by using a combination of a low k polymer material and a high modulus filler. The high quality low k material layers leads to the formation of electronic devices having desirable electrical properties. The low k material layers made in accordance with the present invention have at least one of high mechanical strength, high temperature stability, the absence of residual solvent, a desirable structural network, high breakdown field strength and low leakage current.

One aspect of the present invention relates to a method processing a low k material involving providing a low k material layer comprising one or more low k polymer materials and one or more high modulus fillers on a semiconductor substrate, and chemical mechanical polishing the low k material layer so as to remove a portion of the low k material layer from the semiconductor substrate without substantially damaging unremoved portions of the low k material layer.

Another aspect the present invention relates to low k material layers for a semiconductor structure containing one or more low k polymer materials and one or more high modulus fillers, as well as methods of making the low k material layers.

DISCLOSURE OF INVENTION

The present invention involves forming high quality, well defined low k material layers in semiconductor devices using a combination of a low k polymer material and a high modulus filler. The present invention thus permits CMP processing of low k material layers made in accordance with the present invention.

Low k materials are insulation materials; that is, a material with a low dielectric constant. Low k materials provide electrical insulation between various layers, devices, structures, and regions within semiconductor substrates. For purposes of this invention, low k materials have a dielectric constant below about 3. In another embodiment, low k materials have a dielectric constant below about 2.4. In yet another embodiment, low k materials have a dielectric constant below about 1.8. In still yet another embodiment, low k materials have a dielectric constant below about 1.5.

General examples of low k polymer materials include low k polymers and low k fluoropolymers. Examples of low k materials include polyimides, fluorinated polyimides, polysilsequioxanes such as methyl polysilsequioxanes, butyl polysilsequioxanes, and phenyl polysilsequioxanes, benzocyclobutene (BCB), fluorinated benzocyclobutene, polyphenylene, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), fuorinated poly(arylene ether), poly(p-xylxylenes), fluorinated poly(p-xylxylenes), parylene F, parylene N, parylene C, parylene D, amorphous polytetrafluoroethylene, and the like.

Specific examples of a commercially available low k polymer materials include those under the trade designations Flare™ from AlliedSignal, believed to be derived from perfluorobiphenyl and aromatic bisphenols; Black Diamond™ from Applied Materials; ALCAP-S from Asahi Chemical; SiLK® and Cyclotene® BCB from Dow Chemical; Zirkon from Shipley; Teflon® polytetrafluoroethylene from DuPont; XLK and 3MS from Dow Corning; HSG RZ25 from Hitachi Chemical; HOSP™ and Nanoglass™ from Honeywell Electronic Materials; LKD from JSR Microelectronics; CORAL™ and AF4 from Novellus; and Velox™ PAE-2 from Schumacher.

High modulus fillers are materials that possess both high modulus characteristics and electrically insulating properties, such as carbon based structures and metal oxides. Examples of high modulus fillers include carbon nanotubes, buckyballs, metal oxides, and metal sulfides. Metal oxides and metal sulfides are often in the micro or nano particulate form, xerogels, aerogels, and the like.

The metal of the metal oxides and metal sulfides include transition metals, alkaline earth metals and metallic elements of Group 3A of the periodic table of elements and combinations thereof. Transition metals include Sc, Ti, V, Cr, Mn, Fe, Co, Ni, Cu, Zn, Y, Zr, Nb, Mo, Tc, Ru, Pb, Rh, Pd, Ag, Cd, Ba, La, Hf, Ta, W, Re, Os, Ir, Pt, Au, Hg and Ac. Alkaline earth metals include Be, Mg, Ca, Sr and Ba. Group 3A metallic elements include B, Al, Ga, In and TI. Non-limiting specific examples of metal oxides include titanium dioxide, vanadium oxide, chromium oxide, manganese oxide, beryllium oxide, tungsten oxide, lead oxide, iron oxide, zinc oxide, zirconia, copper oxide, zirconia, yttria, niobia, magnesia, alumina, and the like.

A carbon nanotube is typically a hexagonal network of carbon atoms (from about 6 to about 60 carbon atoms, typically) that is rolled up into a seamless cylinder. Each end may be capped with half of a fullerene molecule. Carbon nanotubes may be prepared by the laser vaporization of a carbon target (a cobalt-nickel catalyst may facilitate growth) or a carbon-arc method to grow similar arrays of single-wall nanotubes. A buckyball is more specifically a buckminsterfullerene, a soccerball-shaped 60-atom cluster of pure carbon. Carbon nanotubes and buckyballs can be rendered electrically insulating, if they are not already electrically insulating, by an oxidation or reduction treatment.

The particle sizes of the high modulus fillers are sufficiently small to fit within the low k polymer matrix and to permit CMP techniques on the low k material layers that contain the low k polymer and high modulus fillers, without damaging the remaining portions of the low k material layers. In one embodiment the average particle size (by weight) of the high modulus fillers is less than about 50 nm. In another embodiment the average particle size of the high modulus fillers is less than about 10 nm. In yet another embodiment the average particle size of the high modulus fillers is less than about 5 nm. In still yet another embodiment the average particle size of the high modulus fillers is less than about 2 nm.

In one embodiment, the low k materials contain from about 0.1% to about 99.9% by weight of one or more low k polymer materials and from about 0.1% to about 99.9% by weight of one or more high modulus fillers. In another embodiment, the low k materials contain from about 1% to about 99% by weight of one or more low k polymer materials and from about 1% to about 99% by weight of one or more high modulus fillers. In yet another embodiment, the low k materials contain from about 10% to about 90% by weight of one or more low k polymer materials and from about 10% to about 90% by weight of one or more high modulus fillers.

In one embodiment, the low k materials contain approximately equal amounts by weight of one or more low k polymer materials and one or more high modulus fillers. In another the low k materials contain a greater amount by weight of one or more low k polymer materials than one or more high modulus fillers. In yet another the low k materials contain a lesser amount by weight of one or more low k polymer materials than one or more high modulus fillers.

The low k materials containing the low k polymer materials and high modulus fillers is typically nanoporous. In this connection, in one embodiment, the low k materials contain from about 5% to about 75% by volume solids (the low k polymer materials and high modulus fillers) and from about 25% to about 95% by volume gas. In another embodiment, the low k materials contain from about 10% to about 50% by volume solids and from about 50% to about 90% by volume gas. In another embodiment, the low k materials contain from about 20% to about 40% by volume solids and from about 60% to about 80% by volume gas. Gases include air and inert gases such as nitrogen, helium, neon, argon, krypton, and xenon.

The low k material is provided over a semiconductor substrate in a casting solvent. The semiconductor substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The substrate may be static or spinning, and the low k materials in the casting solvent are applied by any suitable technique including spin-on techniques. If the low k material/casting solvent is provided over a static substrate, the substrate may be spun to remove excess solvent.

The casting solvent provides a vehicle to apply the low k material to a substrate surface. Casting solvents, as the term is used herein, are those solvents commonly employed to apply low k polymer materials to semiconductor substrate surfaces. Examples of casting solvents include deionized water, suitable organic solvents, organic monomer mixtures, water based dispersions, water-in-oil emulsions, and oil-in-water emulsions (oil meaning organic solvent). Suitable organic solvents are organic compounds that do not dissolve out low k materials, such as benzenes, halobenzenes including chlorobenzenes, anisole, cyclohexanone, lower alkyl alcohols (about 6 or less carbon atoms), lower alkyl ketones (about 6 or less carbon atoms), and lower alkyl esters (about 6 or less carbon atoms) and the like. It is understood that certain compounds, such as ketones and esters, have two or more alkyl groups; and the 6 or less carbon atoms applies to each group. In this connection, methyl amyl ketone is a lower alkyl ketone.

Examples of casting solvents are inorganic or organic solvents including water, ketones such as acetone, methyl ethyl ketone, methyl isobutyl ketone, mesityl oxide, methyl amyl ketone, cyclohexanone and other aliphatic ketones; esters such as methyl acetate, ethyl acetate, iso-amyl acetate, alkyl carboxylic esters; ethers such as methyl t-butyl ether, dibutyl ether, methyl phenyl ether and other aliphatic or alkyl aromatic ethers; glycol ethers such as ethoxy ethanol, butoxy ethanol, ethoxy-2-propanol, propoxy ethanol, butoxy propanol and other glycol ethers; glycol ether esters such as butoxy ethoxy acetate, ethyl 3-ethoxy propionate and other glycol ether esters; alcohols such as methanol, ethanol, propanol, iso-propanol, butanol, iso-butanol, amyl alcohol and other aliphatic alcohols; aliphatic hydrocarbons such as cyclohexane; aromatic hydrocarbons such as benzene, toluene, xylene, and other aromatics or mixtures of aromatic solvents, naphthalene and mineral spirits, and nitro alkanes such as 2-nitropropane. Mixtures of two or more solvents may be employed.

The casting solvent may alternatively or additionally include a water-soluble monomer. Water soluble monomers generally comprise at least one of acrylamide, methacrylamide, acrylic acid, methacrylic acid, an acrylic acid salt, vinyl pyrolidone, and vinyl acetate.

The casting solvent-low k material mixture is provided over a semiconductor substrate and the substrate is spun to remove the casting solvent while the low k material remains on the substrate. The substrate may be heated to ensure removal of substantially all of the casting solvent.

In another embodiment, where the casting solvent is compatible (miscible) with a supercritical fluid, after the casting solvent-low k material mixture is provided over a semiconductor substrate, a supercritical fluid is applied to the substrate. The supercritical fluid displaces the casting solvent, as the casting solvent is substantially removed from the low k material mixture. A supercritical fluid is a fluid medium that is at a temperature that is sufficiently high that it cannot be liquified by pressure. A supercritical fluid relates to dense gas solutions with enhanced solvation powers, and can include near supercritical fluids. The basis for a supercritical fluid is that at a critical temperature and pressure, the liquid and gas phases of a single substance can co-exist.

The supercritical fluid phenomenon is documented, see pages F-62 to F-64 of the CRC Handbook of Chemistry and Physics, 67th Edition, 1986–1987, published by the CRC Press, Inc., Boca Raton, Fla. At high pressures above the critical point, the resulting supercritical fluid, or "dense gas", attains densities approaching those of a liquid and assumes some of the properties of a liquid. These properties are dependent upon the fluid composition, temperature, and pressure. As used herein, the "critical point" is the transition point at which the liquid and gaseous states of a substance merge with each other and represents the combination of the critical temperature and critical pressure for a given substance.

The compressibility of supercritical fluids is great just above the critical temperature where small changes in pressure result in large changes in the density of the supercritical fluid. The "liquid-like" behavior of a supercritical fluid at higher pressures results in greatly enhanced solubilizing capabilities compared to those of the "subcritical" compound, with higher diffusion coefficients and an extended useful temperature range compared to liquids. An interesting phenomenon associated with supercritical fluids is that as the pressure increases, the solubility of the solute often increases by many orders of magnitude with only a small pressure increase.

Near-supercritical liquids also demonstrate solubility characteristics and other pertinent properties similar to those of supercritical fluids. Fluid "modifiers" can often alter supercritical fluid properties significantly, even in relatively low concentrations. In one embodiment, a fluid modifier is added to the supercritical fluid. These variations are considered to be within the concept of a supercritical fluid as used in the context of this invention. Therefore, as used herein, the phrase "supercritical fluid" also denotes a compound above, at, or slightly below the critical temperature and pressure (the critical point) of that compound.

Examples of compounds which are known to have utility as supercritical fluids are given in Table 1.

TABLE 1

EXAMPLES OF SUPERCRITICAL FLUIDS

| Compound | Boiling Point (° C.) | Critical Temperature (° C.) | Critical Pressure (atm) | Critical Density (g/cm.sup.3) |
|---|---|---|---|---|
| $CO_2$ | −78.5 | 31.3 | 72.9 | 0.448 |
| $NH_3$ | −33.35 | 132.4 | 112.5 | 0.235 |
| $H_2O$ | 100.00 | 374.15 | 218.3 | 0.315 |
| $N_2O$ | −88.56 | 36.5 | 71.7 | 0.45 |
| Xenon | −108.3 | 16.6 | 57.6 | 0.118 |
| Krypton | −153.2 | −63.8 | 54.3 | 0.091 |
| Methane | −164.00 | −82.1 | 45.8 | 0.2 |
| Ethane | −88.63 | 32.28 | 48.1 | 0.203 |
| Ethylene | −103.7 | 9.21 | 49.7 | 0.218 |
| Propane | −42.1 | 96.67 | 41.9 | 0.217 |
| Pentane | 36.1 | 196.6 | 33.3 | 0.232 |
| Methanol | 64.7 | 240.5 | 78.9 | 0.272 |
| Ethanol | 78.5 | 243.0 | 63.0 | 0.276 |
| Isopropanol | 82.5 | 235.3 | 47.0 | 0.273 |
| Isobutanol | 108.0 | 275.0 | 42.4 | 0.272 |
| $CClF_3$ | −31.2 | 28.0 | 38.7 | 0.579 |
| $CFH_3$ | −78.4 | 44.6 | 58.0 | 0.3 |
| Cyclohexanol | 155.65 | 356.0 | 38.0 | 0.273 |

Due to the low cost, environmental acceptability, non-flammability, and low critical temperature of carbon dioxide, nitrous oxide, and water, supercritical carbon dioxide, nitrous oxide and/or $H_2O$ fluid is preferably employed in the present invention.

The supercritical fluid is applied to the substrate containing the low k material and the casting solvent in any suitable manner. For example, the wafer containing the low k material and the casting solvent is present in a high pressure chamber. The chamber is flooded with the compound that forms the supercritical fluid (such as carbon dioxide) in-liquid form. The pressure is then increased above the critical pressure, followed by raising the temperature above the critical temperature, thereby converting the compound that forms the supercritical fluid into a supercritical fluid. Next, the pressure is decreased to ambient pressure and the temperature is lowered to room temperature.

Alternatively, after the wafer containing the low k material and the casting solvent is provided in the high pressure chamber and the chamber is flooded with the compound that forms the supercritical fluid in liquid form, the pressure and temperature are raised simultaneously to the critical temperature and pressure ensuring that the liquid phase of the compound that forms the supercritical fluid remains in liquid form.

The supercritical fluid, after replacing the casting solvent, "evaporates", out-gases or otherwise is removed from the low k material without causing any structural damage to the three dimensional network of the low k material. The supercritical fluid is removed completely or at least substantially completely. While not wishing to be bound by any theory, it is believed that this is because detrimental surface tension forces, which can damage the microstructure of the three dimensional network of the low k material, are avoided since there is no liquid-air interface associated with a supercritical fluid. Moreover, since the supercritical fluid is easily and completely removed from the low k material, residual solvent concerns are minimized and/or eliminated (or alternatively, there are inconsequentially small residual amounts). Since residual solvent concerns are minimized, problems such as increases in the dielectric constant of the subsequently formed low k material layer and solvent out gassing induced damage to other layers within the device are minimized and/or eliminated.

The microstructure of the three dimensional network of the low k material formed using a supercritical fluid is characterized by numerous pores or air pockets (in other words, "spongy"). The air pockets provide insulation characteristics to the low k material layer, as air has a dielectric constant of 1.

Optionally, after the casting solvent-low k material mixture is deposited and spun, or after the supercritical fluid is contacted with the low k material covered substrate surface, the substrate may be heated or baked for a short period of time to ensure that the casting solvent or supercritical fluid is completely removed from the low k material.

The thickness of the low k material layer containing the low k polymer material and the high modulus filler uniformly distributed therein formed in accordance with the present invention is not critical to the invention. In one embodiment, however, the thickness of the resulting low k material layer is from about 200 Å to about 20,000 Å. In another embodiment, the thickness of the resulting low k material layer is from about 500 Å to about 10,000 Å. In yet another embodiment, the thickness of the resulting low k material layer is from about 750 Å to about 4,000 Å.

CMP techniques are known. CMP generally involves rubbing a surface of the wafer on which a low k material layer is formed with a polishing cloth stretched over a rotary lathe while supplying a suitable slurry. Due to the increased hardness and mechanical strength of the low k material layers of the present invention compared to conventional low k polymer material layers that do not contain high modulus fillers, CMP techniques may be successfully applied to the low k material layers of the present invention. In particular, due to the increased hardness and mechanical strength of the low k material layers of the present invention, torsional forces of the CMP process do not delaminate or damage the low k material layers during CMP.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond., unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing a low k material, comprising:
providing a low k material layer comprising one or more low k polymer materials and one or more high modulus fillers on a semiconductor substrate using a mixture comprising the one or more low k polymer materials, the one or more high modulus fillers, and a casting solvent; and
chemical mechanical polishing the low k material layer so as to remove a portion of the low k material layer from the semiconductor substrate without substantially damaging unremoved portions of the low k material layer.

2. The method of claim 1, wherein the low k material layer comprises from about 0.1% to about 99.9% by weight of one or more low k polymer materials and from about 0.1% to about 99.9% by weight of one or more high modulus fillers.

3. The method of claim 1, wherein the high modulus filler comprises at least one of a carbon nanotube, a buckyball, a metal oxide, and a metal sulfide.

4. The method of claim 1, wherein the high modulus filler comprises at least one of titanium dioxide, vanadium oxide, chromium oxide, manganese oxide, beryllium oxide, tungsten oxide, lead oxide, iron oxide, zinc oxide, zirconia, copper oxide, zirconia, yttria, niobia, magnesia, and alumina.

5. The method of claim 1, wherein the low k polymer material comprises at least one of a polyimide, a fluorinated polyimide, a polysilsequioxane, benzocyclobutene, fluorinated benzocyclobutene, polyphenylene, polyphenylquinoxaline, copolymers of 2,2-bistrifluoromethyl-4,5-difluoro-1,3-dioxole, a perfluoroalkoxy resin, a fluorinated ethylene propylene, a fluoromethacrylate, a poly(arylene ether), a fuorinated poly (arylene ether), poly(p-xylxylenes), fluorinated poly(p-xylxylenes), parylene F, parylene N, parylene C, parylene D, and amorphous polytetrafluoroethylene.

6. The method of claim 1, wherein the high modulus filler has an average particle size by weight of less than about 5 nm.

7. The method of claim 1, wherein the low k material layer comprises from about 10% to about 50% by volume solids of the low k polymer material and high modulus filler and from about 50% to about 90% by volume gas.

8. The method of claim 1, wherein the low k material layer has a dielectric constant below about 1.8.

9. A method of making a low k material layer on a semiconductor substrate, comprising:
depositing a mixture comprising a low k material and a casting solvent on the semiconductor substrate, low k material comprising a low k polymer material and a high modulus filler; and
removing the casting solvent from the semiconductor substrate to form the low k material layer comprising the low k material.

10. The method of claim 9, wherein removing the casting solvent from the semiconductor substrate involves spinning the semiconductor substrate and optionally heating the semiconductor substrate to form the low k material layer.

11. The method of claim 9, wherein removing the casting solvent from the semiconductor substrate involves:

contacting the mixture with a supercritical fluid whereby the casting solvent is removed from the mixture; and permitting the supercritical fluid to evaporate thereby forming the low k material layer.

12. The method of claim 9, wherein the casting solvent comprises at least one of deionized water, a water based dispersion, a water-in-oil emulsion, an oil-in-water emulsion, cyclohexane, benzenes, chlorobenzenes, anisole, cyclohexanone, acetone, methyl ethyl ketone, methyl isobutyl ketone, mesityl oxide, methyl amyl ketone, cyclohexanone, methyl acetate, ethyl acetate, iso-amyl acetate, alkyl carboxylic esters, methyl t-butyl ether, dibutyl ether, methyl phenyl ether, ethoxy ethanol, butoxy ethanol, ethoxy-2-propanol, propoxy ethanol, butoxy propanol, butoxy ethoxy acetate, ethyl 3-ethoxy propionate, methanol, ethanol, propanol, iso-propanol, butanol, iso-butanol, amyl alcohol, benzene, toluene, xylene, naphthalene, mineral spirits, and 2-nitropropane.

13. The method of claim 11, wherein the supercritical fluid comprises at least one of $CO_2$, $N_2O$, $H_2O$, $C_2H_6$, $CFH_3$, $CClF_3$, $NH_3$, xenon, krypton methane, ethylene, propane, pentane, methanol, ethanol, isopropanol, isobutanol, and cyclohexanol.

14. The method of claim 9, wherein the low k polymer material comprises at least one of a polyimide, a fluorinated polyimide, a polysilsequioxane, benzocyclobutene, fluorinated benzocyclobutene, polyphenylene, polyphenylquinoxaline, copolymers of 2,2-bistrifluoromethyl-4,5-difluoro-1,3dioxole, a perfluoroalkoxy resin, a fluorinated ethylene propylene, a fluoromethacrylate, a poly(arylene ether), a fuorinated poly(arylene ether), poly(p-xylxylenes), fluorinated poly(p-xylxylenes), parylene F, parylene N, parylene C, parylene D, and amorphous polytetrafluoroethylene and the high modulus filler comprises at least one of a carbon nanotube, a buckyball, a metal oxide, and a metal sulfide.

15. The method of claim 9 further comprising chemical mechanical polishing the low k material layer.

16. A method of making a low k material layer on a semiconductor substrate, comprising:

depositing a mixture comprising a low k material and an organic casting solvent on the semiconductor substrate, low k material comprising a low k polymer material and a high modulus filler; and removing the casting solvent from the semiconductor substrate to form the low k material layer comprising the low k material.

17. The method of claim 16, wherein removing the organic casting solvent from the semiconductor substrate involves spinning the semiconductor substrate and optionally heating the semiconductor substrate to form the low k material layer.

18. The method of claim 16, wherein removing the organic casting solvent from the semiconductor substrate involves:

contacting the mixture with a supercritical fluid whereby the organic casting solvent is removed from the mixture; and permitting the supercritical fluid to evaporate thereby forming the low k material layer.

19. The method of claim 16, wherein the organic casting solvent comprises at least one of a benzene, a lower alkyl alcohol, and a lower alkyl ketone.

20. The method of claim 18, wherein the supercritical fluid comprises at least one of $CO_2$, $N_2O$, $H_2O$, $C_2H_6$, $CFH_3$, $CClF_3$, $NH_3$, xenon, krypton, methane, ethylene, propane, pentane, methanol, ethanol, ethanol, isopropanol, isobutanol, and cyclohexanol.

21. The method of claim 16 further comprising chemical mechanical polishing the low k material layer.

* * * * *